United States Patent [19]

Peters

[11] 3,869,292

[45] Mar. 4, 1975

[54] LIGHT-SENSITIVE COMPOSITIONS AND LIGHT-SENSITIVE MATERIALS SUCH AS PRINTING PLATES

[75] Inventor: Martinus T. J. Peters, Venlo, Netherlands

[73] Assignee: Oce-van der Grinten, N.V., Venlo, Netherlands

[22] Filed: May 3, 1973

[21] Appl. No.: 357,025

[30] Foreign Application Priority Data

May 5, 1972 Great Britain .................... 21191/72

[52] U.S. Cl. .................... 96/115 R, 96/33, 96/35.1, 96/36.3, 96/75, 96/86 P, 96/91 R, 96/91 D, 96/91 N

[51] Int. Cl. ............................ G03f 7/08, G03c 1/52

[58] Field of Search .......... 96/91 R, 91 N, 91 D, 93, 96/115 R, 115 P, 33, 35.1, 36.3, 75

[56] References Cited

UNITED STATES PATENTS

| | | | |
|---|---|---|---|
| 3,230,087 | 1/1966 | Sus et al. | 96/33 |
| 3,396,019 | 8/1968 | Uhlig | 96/75 |
| 3,396,020 | 8/1968 | Borchers | 96/75 |
| 3,502,470 | 3/1970 | Delzenne et al. | 96/91 D |
| 3,589,898 | 6/1971 | Fry et al. | 96/91 D |
| 3,615,532 | 10/1971 | Silver | 96/75 |
| 3,625,919 | 12/1971 | Kamogawa et al. | 96/91 R |
| 3,647,443 | 3/1972 | Rauner et al. | 96/91 D |
| 3,666,473 | 5/1972 | Colom et al. | 96/91 D |
| 3,669,658 | 6/1972 | Yonezawa et al. | 96/91 D |
| 3,778,270 | 12/1973 | Roos | 96/115 R |

*Primary Examiner*—Charles L. Bowers, Jr.
*Attorney, Agent, or Firm*—Albert C. Johnston

[57] ABSTRACT

Mixtures of light-sensitive compounds with vinylphenol resins constitute new light-sensitive compositions which are especially valuable for use as light-sensitive coatings of materials such as printing plates. The resin advantageously is a polymer or copolymer of ortho-vinylphenol, and the light-sensitive compound an aromatic ester or amide of an ortho-naphthoquinone diazide sulfonic or carboxylic acid. Aluminum foil offset plates coated with the compositions give remarkably long printing runs, due to the exceptional wear resistance and good adhesion exhibited by image areas which contain a vinylphenol resin.

10 Claims, No Drawings

LIGHT-SENSITIVE COMPOSITIONS AND LIGHT-SENSITIVE MATERIALS SUCH AS PRINTING PLATES

The present invention relates to light-sensitive compositions for use in the light-sensitive coatings of materials such as printing plates, to the resulting light-sensitive materials, and to processes for producing images on them.

British Pat. Specification No. 699,412 describes printing plates coated with a light-sensitive mixture of a water-insoluble ester or amide of an ortho-naphthoquinone diazide sulphonic or carboxylic acid and an alkali-soluble resin such as novolak, colophony or shellac.

Light-sensitive materials containing aromatic azides and phenolformaldehyde resins, shellac or colophony are disclosed in British Pat. Specification No. 745,886.

British Pat. Specification No. 1,110,017 relates to printing plates coated with novolak or another alkali-soluble resin, such as styrene copolymer containing carboxyl groups, and a condensation product of para-diazo diphenylamine.

According to the present invention there are provided light-sensitive compositions containing a light-sensitive constituent and a vinyl-phenol resin, i.e., a polymer or copolymer of a vinylphenol. The invention also provides light-sensitive materials such as printing plates which comprise suitable base materials coated with such light-sensitive compositions.

The poly-vinylphenols which have been found effective for use according to the invention are homopolymers and copolymers of ortho-, meta- and para-vinylphenols. The vinylphenols polymerized may be non-substituted or may carry any of various substituents that do not markedly affect the properties of the corresponding polymers. For example, such substituents may be alkoxy groups such as methoxy or ethoxy groups or alkyl groups such as methyl or isopropyl groups. The homopolymers of ortho-vinylphenol are particularly advantageous, but the poly-vinylphenols may be used also in the form of other homopolymers, of copolymers with one another, or of copolymers with other vinyl compounds such as styrene, acrylic acid, acrylic acid esters, methacrylic acid and methacrylic acid esters.

The molecular weight of the polymer does not appear to be a critical factor. Those having a number averaged molecular weight of between 2,000 and 60,000 are preferred, but the polymers having molecular weights lower or higher than this range may also be used.

The poly-vinylphenols may be prepared by block polymerization, emulsion polymerization or solution polymerization of the corresponding monomers in the presence of a cationic catalyst such as boron trifluoride etherate. Radical polymerization processes induced by heat, by radiation or by catalysts such as azobisisobutyronitrile may also be employed. Such polymerization processes are described in detail, for example, in Journal of Polymer Science, Part A1, Vol. 7 (1969), pages 2175–2184 and 2405–2410, in Journal of Organic Chemistry, Vol. 24 (1959), pages 1345–1347, and in La Chimica e l'Industria, Vol. 50 (1968), pages 742–745.

Vinylphenols useful for the production of the polymers may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy-alkylphenols or by decarboxylation of hydroxy cinnamic acids resulting from the reaction of substituted or non-substituted hydroxy benzaldehydes with malonic acid. Various processes suitable for production of the vinylphenol are described in detail, for example, in Journal of Organic Chemistry, Vol. 23 (1958), pages 544-549, in Arkiv foer Kemi, Mineralogi och Geologi, Vol. 16A (1943) No. 12, pages 1–20, and in Annalen der Chemie, Vol. 413 (1919), pages 287–309.

Compounds particularly useful as the light-sensitive constituent of the new compositions are ortho-quinonediazides such as the aromatic esters or amides of ortho-naphthoquinonediazide sulphonic or carboxylic acids.

The light-sensitive constituent, however, may be any of the various light-sensitive compounds which are known to be suitable for sensitizing materials such as light-sensitive printing plates. Examples of such compounds include: para-quinonediazides such as the β-naphthyl amide of a para-benzoquinonediazide sulphonic acid; para-iminoquinonediazides such as described in British Pat. Specification Nos. 723,382 and 942,404; organic solvent soluble condensation products of diazonium salts with formaldehyde such as described in British Pat. Specification 1,110,017 and French Pat. Specification No. 2,022,413; co-condensation products of aromatic diazonium salts and other aromatic products with formaldehyde, such as the co-condensation product of a salt of para-diazo diphenyl-amine and 4,4'-bis-methoxymethyl diphenylether with formaldehyde; and aromatic azides such as the azido compounds described in British Pat. Specification No. 745,886.

Other light-sensitive substances that may be used include low molecular aromatic diazonium salts, diazo sulphonates of aromatic and heterocyclic amines and polymeric products containing quinonediazide, diazo, azido, or other light-sensitive groups. When a polyethylene oxide is used in admixture with the poly-vinylphenol, an organic halogen compound such as bromoform may be used for sensitizing the composition.

In addition to the light-sensitive constituent, other constituents such as dyes, softeners and other resins such as novolak may be used in admixture with the poly-vinylphenol in the light-sensitive compositions according to the invention.

The light-sensitive materials made by use of these compositions may be printing plates, color proofing materials or oter materials of kinds used in the graphic art. Depending upon the particular use, the support may be selected from among commonly used materials such as plastic or metallic foils or plates. For printing plates according to the invention, bimetallic, trimetallic and aluminum foils and plates are preferred. In the use of foils and plates having an aluminum surface to be coated with the light-sensitive composition, the aluminum surface is usually roughened by a mechanical, chemical or electrochemical treatment, and it may be anodised or precoated by treatment with a hot solution of sodium silicate, potassium zirconium fluoride, ammonia, polyvinylphosphonic acid, polyacrylic acid or other substances that will produce a protective hydrophilic layer on the surface. An aluminum support may also be used without a precoat if the light-sensitive constituent of the composition is one which is compatible with, or not adversely affected by, the metal surface.

Printing plates according to the invention may be prepared by coating a metallic support with a solution of the light-sensitive constituent and the polymer in an organic solvent. Solvents such as alcohol, 2-ethoxy ethanol, 2-methoxy ethanol, methyl ethyl ketone, dioxane or dimethyl formamide, or mixtures of such solvents, may be used. The ratio of the resin to the light-sensitive substance is not critical but usually 0.2 to 20 parts by weight of polymer are used for each part of light-sensitive substance. The polymer containing layer may have the usual thickness; for example, a coating weight of between 0.25 and 25 g per $m^2$ is quite satisfactory. After exposure under a transparent original the plate may be developed with organic solvents or with alkaline solutions containing one or more alkaline substances such as sodium hydroxide, sodium carbonate, trisodium phosphate and sodium silicate. If the support surface consists of treated or untreated aluminum, the plates may be subjected to an aftertreatment with a dilute acid solution, such as a 2% phosphoric acid solution, to improve the hydrophilic properties of the image background.

Exposed bimetallic plates coated with the light-sensitive compositions according to the invention may be etched with the common etching solutions. These compositions show excellent etch-resisting properties.

Remarkably long printing runs can be obtained with the printing plates provided according to the invention. These runs are attributable to the fact that the image parts of the plates, which contain a vinylphenol resin, have a very high wear resistance and good adhesion. Printing plates sensitized with a light-sensitive composition containing an ortho-quinonediazide and a polyvinylphenol are especially suitable for very long printing runs. For example, the printing run obtainable with an aluminum plate coated with an orthonaphthoquinonediazide sulphonic acid ester and a polyvinylphenol is more than two times longer than the printing run obtainable with the corresponding printing plate containing a novolak instead of the polyvinylphenol in the light-sensitive coating.

Further particulars of preferred ways of carrying out the invention will be evident from the following illustrative examples.

EXAMPLE 1

Three printing plates designated *a*, *b* and *c* were prepared by coating three sheets of mechanically roughened aluminum foil respectively with the following solutions:

*a*.

5 g of the condensation product of naphthoquinone-(1,2)diazide-(2)-5-sulphochloride with 3,5-dimethylphenol
10 g of a polymer of ortho-vinylphenol having a number averaged molar weight of 10,000
50 ml of methyl ethyl ketone
50 ml of dioxane.

*b*.

5 g of the same condensation product
10 g of a polymer of ortho-vinylphenol having a number averaged molar weight of 3,800
50 ml of methyl ethyl ketone
50 ml of dioxane.

*c*.

5 g of the same condensation product
10 g of a novolak (Alnovol PN429, registered trademark of 'Reichhold - Albert - Chemie A.G.')
50 ml of methyl ethyl ketone
50 ml of dioxane.

The coating weight of each of the plates was 2.2 g per $m^2$ after drying at a temperature of 80°C.

The coated foils were exposed under a positive original and developed by treatment with a cotton wool pad soaked in an aqueous solution containing 2.5% by weight of trisodium phosphate (o aq.) and 2% by weight of sodium silicate (o aq.).

The developed and rinsed plates were treated with a 2% aqueous solution of phosphoric acid and inked up with a greasy printing ink. The resulting plates were used in an offset printing machine. No wear was observed on plates *a* and *b* even after 50,000 prints had been run, whereas plate *c* showed the first traces of wear on the prints after a printing run of 22,000.

EXAMPLE 2

Two printing plates designated *a* and *b* were prepared by coating two sheets of mechanically roughened aluminum foil respectively with the following solutions:

*a*.

5 g of 1-azido-2,5-dimethoxy - 4 -(p-tolylthio)-benzene
10 g of a polymer of ortho-vinylphenol having a number averaged molar weight of 3,800
50 ml of methyl ethyl ketone
50 ml of dioxane.

*b*.

5 g of 1-azido-2,5-dimethoxy - 4 -(p-tolylthio)-benzene
10 g of a novolak (Alnovol PN429, registered trademark of 'Reichhold - Albert - Chemie A.G.')
50 ml of methyl ethyl ketone
50 ml of dioxane.

After drying at a temperature of 80°C, the coating weight of each of the plates was 2.2 g per $m^2$.

The coated foils were exposed under a negative original and developed by treatment with a cotton wool pad soaked in a developer solution. The developer solution used for plate *b* was an aqueous solution containing 2.5% by weight of trisodium phosphate (o. aq.) and 2% by weight of sodium silicate (o. aq.). As plate *a* could not be developed with the same solution, it was developed with a mixture of 8 parts of volume of ethylene glycol, 1 part by volume of diethylene glycol monomethyl ether and 0.09 parts by volume of concentrated sulphuric acid.

The developed and rinsed plates were treated with a 2% aqueous solution of phosphoric acid and inked up with a greasy printing ink. The resulting plates were used in an offset printing machine. Plate *a* showed the first traces of wear on the prints after a printing run of 35,000, and plate *b* after a printing run of 18,000.

EXAMPLE 3

Four printing plates designated *a*, *b*, *c* and *d* were prepared by coating four sheets of mechanically roughened aluminum foil respectively with the following solutions:

*a*.

13 g of 1-(p-tolyl sulphonylimino)-2-(2',3'-dimethyl phenyl aminosulphonyl)-benzoquinone-(1,4)-diazide-(4)
3 g of a polymer or ortho-vinylphenol having a number averaged molar weight of 10,000
100 ml of ethylene glycol monomethyl ether.

*b.*
10 g of the amide of benzoquinone-(1,4)-diazide-(4)-2-sulphonic acid and 2-naphtylamine
2 g of a polymer of ortho-vinylphenol having a number averaged molar weight of 10,000
100 ml of ethylene glycol monomethyl ether.

*c.*
10 g of the 2-naphthyl sulphonate of a polycondensate of p-diazo diphenyl amine and formaldehyde
2 g of a polymer of ortho-vinylphenol having a number averaged molar weight of 10,000
100 ml of ethylene glycol monomethyl ether.

*d*
5 g of the condensation product of naphthoquinone-(1,2)-diazide-(2)-5-sulphochloride with a 3,5-dimethylphenol
10 g of a polymer of para-vinylphenol having a number averaged molar weight of 7,500
50 ml of methyl ethyl ketone
50 ml of dioxane.

The coating weight of the plates was 2.2 g per $m^2$ after drying at a temperature of 80°C.

The coated foils were exposed under an original and developed by treatment with a cotton wool pad soaked in a developer solution. The following developer solutions *a'* to *d'* were used for the plates *a* to *d* respectively:

*a'*. an aqueous solution containing 1.5% by weight of $Na_3PO_4.12H_2O$
*b'*. an aqueous solution containing 0.5% by weight of $Na_3PO_4.12H_2O$
*c'*. a solution containing 1 part by volume of concentrated sulphuric acid, 30 parts by volume of propyl alcohol and 70 parts by volume of water
*d'*. an aqueous solution containing 5% by weight of $Na_3PO_4.12H_2O$ and 5% by weight of $Na_2SiO_3.9H_2O$.

The developed and rinsed plates were treated with a 2% aqueous solution of phosphoric acid and inked up with a greasy printing ink. The resulting plates were used in an offset printing machine. They delivered printing runs which were twice the printing runs obtainable with corresponding printing plates in which the vinylphenol resin had been replaced by a novolak.

I claim:

1. A light-sensitive composition for graphic arts such as for sensitizing printing plates, comprising a mixture of a light-sensitive diazo or azido compound and, per part of said compound, about 0.2 to 20 parts by weight of a vinyl phenol resin produced by normal vinyl polymerization and selected from the group consisting of homopolymers and copolymers of ortho-, meta-, and para-vinyl phenols and wherein, when said resin is a copolymer, the comonomer of the copolymer is another vinyl compound.

2. A light-sensitive composition according to claim 1, said resin being a polymer or copolymer of ortho-vinylphenol.

3. A light-sensitive composition according to claim 1, said light-sensitive compound being an ortho-quinone diazide.

4. A light-sensitive composition according to claim 1, said light-sensitive compound being an aromatic ester or amide of an ortho-naphthoquinone diazide sulphonic or carboxylic acid.

5. A light-sensitive composition for graphic arts such as for sensitizing printing plates, comprising a mixture of a light-sensitive aromatic ester or amide of an ortho-naphtho-quinone diazide sulfonic or carboxylic acid and, per part of said light-sensitive compound, about 0.2 to 20 parts by weight of a vinylphenol resin selected from the group consisting of homopolymers and copolymers of ortho-vinyl phenol and wherein, when said resin is a copolymer, the comonomer of the copolymer is another vinyl compound.

6. A light-sensitive printing plate comprising a support coated with a light-sensitive composition according to claim 1.

7. A light-sensitive printing plate comprising a support coated with a light-sensitive composition according to claim 2.

8. A light-sensitive printing plate comprising a support coated with a light-sensitive composition according to claim 3.

9. A light-sensitive printing plate comprising a support coated with a light-sensitive composition according to claim 4.

10. A light-sensitive printing plate comprising a support coated with a light-sensitive composition according to claim 5.

* * * * *